March 25, 1969 J. C. CARROLL 3,435,360

ZERO OUTPUT IMPEDANCE AMPLIFIER

Filed April 5, 1966

INVENTOR
JAMES CHARLES CARROLL
BY
ATTORNEY 3,435,360
Patented Mar. 25, 1969

3,435,360

ZERO OUTPUT IMPEDANCE AMPLIFIER

James C. Carroll, Raleigh, N.C., assignor to International Telephone and Telegraph Corporation Filed Apr. 5, 1966, Ser. No. 540,383
Int. Cl. H03g *3/30*; H03f *1/34, 1/38*
U.S. Cl. 330—25 10 Claims

ABSTRACT OF THE DISCLOSURE

The invention provides an amplifier having a combination of positive and negative gain feedback circuits. The signals in these circuits vary as a function of load current to enable a compensation of amplifier gain losses due to load changes. Thus, the output impedance remains constant despite variations in the loading.

Figure 1:
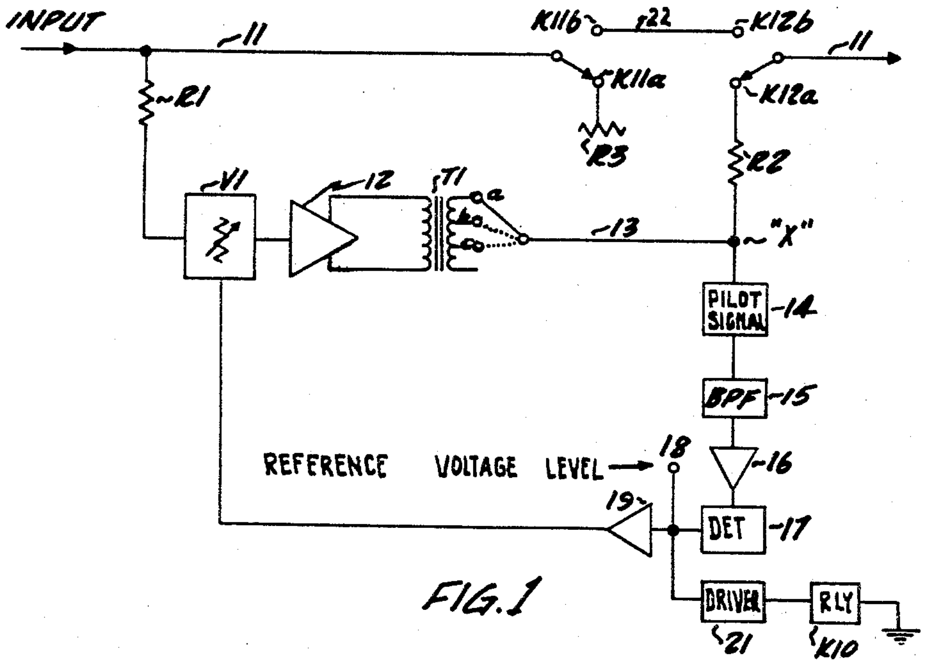

This invention relates to amplifiers and more particularly to amplifiers having output impedances which can be set to have either positive, zero, or negative values.

Negative and zero impedance amplifiers find extensive use in repeater circuitry used in telephone carrier systems. Amplifiers displaying zero output impedance characteristics are particularly useful as signal path amplifiers in repeater circuitry wherein a voice signal by-pass circuit is provided. A negative impedance output is used to reduce the overall impedance of a system and thereby increase the current flowing through the system.

The effective output impedance of an amplifier determines the stability of the output signal of the amplifier and/or the amount of gain the amplifier provides. For example, decreasing the effective output impedance of an amplifier so that it approaches zero tends to make the output voltage constant irrespective of load impedance. On the other hand, increasing the output impedance of an amplifier tends to make the output current constant irrespective of load impedance.

During operation, it is often necessary to control the output impedance of the signal path amplifier to be certain that a sudden application and removal of a load will not adversely effect the output voltage level of the amplifier. For example, the signal path amplifier is used in conjunction with a pilot signal to regulate the gain of a carrier system. The incoming pilot signal is applied through a regulating circuit to control the amplification provided by the signal path amplifier.

Zero output impedance effects have been obtained by using large amounts of negative feedback derived from the amplifier output voltage. However, this method of obtaining the zero output impedance necessitated an amplification system having a large open loop gain. Thus, an excessive number of amplifying stages must be used which in turn, introduces stability problems and unduly increases the complexity and cost of the system. The stability problem is aggravated when the zero output impedance is required at some remote point that is coupled to the amplifier output either through high impedance conductors or through lossy coupling networks.

Accordingly, it is an object of this invention to provide new and unique amplifiers having zero output impedances.

More particularly, it is an object of this invention to provide a two stage amplifier having both positive and negative feedback paths whereby the output impedance of the amplifier can be adjusted to provide positive, zero, or negative output impedance.

Yet a more particular object of this invention is to provide signal path amplifiers for a pilot carrier regulating circuit capable of maintaining a constant voltage output level regardless of whether operating under full load or reduced load conditions such as occur when the carrier signal goes through the signal path amplifier and when the amplifier is bypassed, respectively.

Yet another object of the invention is to provide amplification with an output impedance which can be continuously varied from some positive maximum value to some negative maximum value in a manner which does not vary the unloaded voltage gain of the amplifier.

Another object of the invention is to provide an amplifier which generates a controlled negative impedance at its output terminals.

In accordance with one embodiment of the invention, a two stage direct coupled transistorized amplifier is used. The output of the second stage provides negative and positive voltage feedback. An A.C. voltage negative feedback is used for voltage gain stabilization and a D.C. negative feedback voltage is used for bias stability. An A.C. positive voltage feedback that is a function of load current enables the output impedance to be increased to maximum positive value. If the positive feedback is adjusted to compensate for the gain loss in the amplifier due to increased loading, the load voltage will remain constant and the amplifier will have a zero output impedance.

Figure 2:
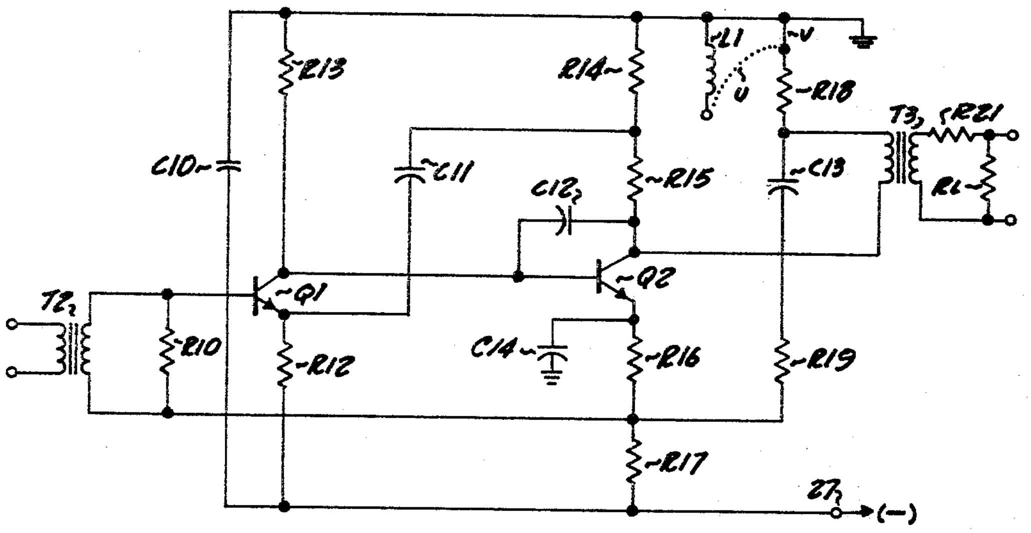

The above mentioned and other objects and features of this invention and the manner of obtaining them will become more apparent and the invention itself will be best understood by making reference to the following description of an embodiment of the invention taken in conjunction with the attached drawing, in which:

FIG. 1 shows, in block diagram form, the use of the inventive amplifier in a carrier system regulating circuit; and FIG. 2 schematically illustrates a preferred embodiment of the inventive amplifier.

To facilitate an understanding of the invention, it is described hereinafter in connection with regulating circuitry used in carrier systems. However, the invention is amenable to general application. Thus, the terms used and items described herein are not to be construed as limiting the invention to specific devices, but are to be construed as encompassing the full range of equivalents allowed under established principles of patent law.

FIG. 1 shows a portion of a carrier communication system comprising the regulation circuitry. This system is designed to transmit voice and other signals over a cable 11 which, in this case, serves as a communication path. The signal on cable 11 is normally applied through a signal path bridge network (represented in FIG. 1 by resistor R1) to a means (herein represented by a diode vari-losser V1) for regulating the signal level. The output of the regulator V1 is coupled to a signal path amplifier 12. The output of amplifier 12 is coupled back to the cable 11 through transformer T1, conductor 13 and a bridge network, represented by resistor R2 and transfer contacts K12*a*.

The signal on the cable 11 is amplified by the in-path amplifier 12 to restore it to some reference level. The amount of amplification is controlled responsive to a pilot signal transmitted over the cable 11 along with the voice signals. This pilot signal is compared to a reference level, and then the difference between the reference level and the pilot signal is used to control the regulator network.

More particularly, the signal at the junction of conductor 13 and the bridge network R2 is applied through an outgoing pilot bridging circuit 14 to a band pass filter 15. The band pass filter is designed to pass the pilot signal while blocking the voice carrier signal. The pilot signal output of the band pass filter 15 is amplified by an outgoing pilot monitor amplifier 16. The output of amplifier 16 is coupled to detector circuitry 17 which provides a D.C. voltage which can be compared to a reference voltage 18. Thus, amplifier 16 is designed to provide a signal output having a detected level equal to the reference voltage 18. The reference voltage may be provided in any suitable manner, as by a Zener network, for example. The difference between the reference level at 18 and the detected pilot signal level at the output of detector 17 is used as input signal to D.C. amplifier 19. The output of the D.C. amplifier 19 controls variable regulator V1.

The difference between the pilot signal level at the output of the detector circuitry 17 and the reference voltage 18 is also used to provide a signal to relay driver circuit 21. When the difference between the reference voltage level and the pilot signal voltage level at the output of the detector circuitry 17 is at a predetermined value, the output of the driver 21 is sufficient to operate a by-pass relay K10. The operation of by-pass relay K10 causes a transfer of contacts K11, K12 to open the normally closed contacts K11*a*, K12*a* and close the normally open contacts K11*b*, K12*b*. Thus, the operation of by-pass relay K10 closes a by-pass circuit around the signal path amplifier 12 and associated regulating feedback circuitry and through cable section 22.

Prior to the operation of relay K10, the incoming cable section of cable 11 is terminated by a termination means (such as a resistor R3) which insure that the cable impedance is properly matched. The circuit values selected for resistor R2 and the taps *a*, *b*, and *c* on the secondary of transformer T1 are also used for impedance matching purposes. Conductor 13 is here shown connected to tap *a*; however, the dotted line sections indicate that conductor 13 could also be connected to any of the other taps, *b* or *c*. Each of these taps, of course, also represents a different impedance option.

In operation, the disclosed portion of the carrier system is used to regulate the gain of the carrier signal when relay K10 is unoperated, and the voice signal is transmitted through the signal path amplifier 12. If the signal strength on cable 11 is low, for example, the voltage level at point X is lower than normal and consequently the output of detector 17 is also lower than normal. The input to the D.C. amplifier 19 is made higher than normal by the reference voltage level at 18. This causes the regulator V1 to remove some of its attenuation from the signal path. Similarly, if the pilot signal strength is high on cable 11 the voltage at point X is also higher and regulator V1 will add attenuation under the control of amplifier 19.

When the pilot signal strength level at point X is different from the normal amplitude by a certain prescribed amount the regulator V1 can not compensate for the difference. Then, the by-pass relay K10 operates.

As is readily distinguishable, the operation of the relay K10 radically changes the loading on the output of amplifier 12. If the amplifier does not have an effectively zero output impedance, the change of load which results when relay K10 operates could be sufficient to substantially raise the voltage level at point X. This would, in turn, raise the output of the detector 17 to a level which might release relay K10. When it returns to its normally unenergized condition, the cable 11 is again connected to load the amplifier 12 at the output signal level which causes relay K10 to operate. Thus, the system might oscillate between the amplified output and the by-passed output. To prevent this instability, amplifier 12 must have substantially a zero output impedance.

FIG. 2 illustrates an improved amplifier for use in the box 12 of FIG. 1. This amplifier is capable of providing negative, zero, or positive output impedance with only two cascaded transistor stages. When serving as the signal path amplifier of FIG. 1, the amplifier of FIG. 2 is coupled to the regulating network V1 of FIG. 1 through transformer T2. The transformer provides D.C. isolation and impedance transformation between the amplifier and the regulator.

As shown in FIG. 2 one side of the secondary of transformer T2 is connected to the base of a first transistor Q1. The secondary winding of transformer T2 is bridged by a resistor R10 which is in parallel with the base input impedance of transistor Q1 and, therefore, helps to determine the input impedance of the amplifier.

The emitter of transistor Q1 is connected to a source of negative D.C. voltage 27, through biasing means such as resistor R12. The collector of transistor Q1 is connected to ground through a load resistor R13. A filter capacitor C10 is connected between source 27 and ground to be certain that the D.C. bias voltages are ripple free.

The base of transistor Q2 is coupled directly to the collector of transistor Q1. Resistors R16, R17 are coupled between the emitter of transistor Q2 and (−) battery to provide bias and serve as a path for emitter current. Capacitor C14 by-passes the emitter of transistor Q2 to ground and thus provides an A.C. ground point. A high frequency negative feedback path includes capacitor C12 which is connected between the collector and the base of transistor Q2. Thus, capacitor C12 provides a high frequency gain roll off. Resistors R14, R15 are connected between the collector of transistor Q2 and ground to serve as the load resistor for that transistor. The collector of transistor Q2 is coupled to one side of the primary winding of transformer T3 (which may be the same as transformer T1 of FIG. 1, for example). The other end of the primary winding of transformer T3 is connected to ground through means for generating a feed back voltage, such as resistor R18.

The two stage amplifier has means for providing both a positive and a negative feedback. Means, such as the resistors R14 and R15, are connected in a voltage divider configuration to generate a certain voltage which is fed back to the emitter bias circuit of transistor 21 through capacitor C11. Thus, if the voltage drop across resistor R14 increases, the negative bias on the emitter of transistor Q1 decreases thereby reducing the voltage applied to the base of transistor Q2. This, in turn, reduces the voltage drop across resistor R14. Thus, the voltage divider comprising resistors R14, R15 and the capacitor C11 form a feedback circuit which determines the gain of the amplifier.

Means are provided for applying the positive feedback voltage generated across resistor R18 to control transistor Q1. More particularly, resistor R18 is coupled to the base of transistor Q1, through the series circuit including the capacitor C13 and an L pad that comprises resistor R19 coupled to the junction of resistor R16, R17. The junction point or resistor R16, R17 is connected to the base of transistor Q1 through resistor R10. Resistors R16, R17 are connected in parallel to ground through capacitors C14, C10 respectively.

On the output at the secondary of transformer T3, resistor R21 is an equivalent representation of the total resistance or loss in the coupling from the amplifier output to the point where the zero or negative impedance is desired. Resistance RL is also an equivalent which represents the load.

Means, such as inductor L1, are provided for generating a positive feedback voltage which varies directly with frequency, i.e. the feedback voltage decreases with decreasing frequency. As shown in FIG. 2, the resistor R18 is connected to ground by the strap V. When desired, strap V is removed and replaced by strap U shown by a dotted line, which places inductor L1 in the circuit between resistor R18 and ground. The inductor L1 is thus connected to act as a low frequency short circuit and high frequency impedance is desired.

In a preferred embodiment of the invention which was actually constructed and tested with excellent results, the following components were successfully used:

| | |
|---|---|
| R10—3.16K ohms | R16, R17—110Ω |
| R12—1.33K ohms | R18—3.3Ω |
| R13—4.64 | R19—133Ω |
| R14—50Ω | C10—22 at 35 v. |
| R15—1.96K ohms | C11—6.8 mfd. at 35 v. |
| L1—10 μh. | C12—10 pf. at 100 v. |
| Q1—2N2222A | C13—2.2 mfd. at 35 v. |
| Q2—2N2222A | C14—2.2 mfd. at 35 v. |

In operation, the A.C. input signal applied to the amplifier of FIG. 2 is developed across the secondary winding of transformer T2 and applied to the base of the transistor Q1. The signal which is thus applied is amplified and inverted by the transistor Q1. The amplified and inverted signal is applied directly to the base of the second transistor Q2. The second transistor again inverts and amplifies the signal. Thus, the signal at the collector of transistor Q2 is an amplified version of the signal originally appearing at the base of the transistor Q1. This amplified signal is applied to energize transformer T3 and to thereby serve as the output signal.

It is important that the output imepdance be constant without regard as to whether or not the complete cable system is or is not the load. In other words, the output signal must remain constant despite a widely varying load. According to the invention, this is accomplished through the use of an independent positive feedback circuit. The positive feedback signal is developed across resistor R18 which is coupled between the output transformer T3 and ground. The signal across resistor R18 is applied to the base of the first transistor Q1 through the coupling capacitor C13 and an L pad attenuator. The L pad attenuator circuit values are selected so that the positive feedback signal amplitude is not enough to cause oscillation, but is sufficient to compensate for the amplifier gain dimunition caused by increased loading.

Thus, the amplifier using positive A.C. feedback which is a function of load current exhibits zero output impedance characteristics. The zero output impedance characteristics are obtained without using large amounts of negative feedback which inherently requires an expensive number of amplifying stages. The many amplifying stages that the circuitry disclosed herein eliminates were needed to provide the large open loop gain required with the negative feedback method of obtaining zero impedance characteristics.

Independent negative feedback means are still required and are provided to control the gain and increase the stability of the circuit. The negative feedback is developed across resistor R14 and applied to the emitter of transistor Q1 by capacitor C10. Among other things, the negative feedback at the emitter of Q1 controls the characteristic shape of the gain versus frequency of the amplifier and provides a flat response curve by reducing the gain. For example, capacitor C12 is coupled from the collector of the base of transistor Q2. The negative feedback through this capacitor prevents a peak in the response at the high frequency end. Thus, noise transmitted through the first stage to the base of the transistor Q2 is cancelled by the negative feedback received through capacitor C12.

While the principles of the invention have been described above in connection with specific apparatus and applications, it is to be understood that this description is made only by way of example and not as a limitation on the scope of the invention.

I claim:

1. A two stage amplifier consisting of only a first and a second transistor in each of said stages respectively for amplifying the signals transmitted through said amplifier,
   one side of an output transformer coupled to the collector of said second transistor,
   means for applying D.C. biasing potentials to said first and second transistors for establishing the operating points thereof,
   means for compensating for gain losses in the amplifier in order to maintain a zero output impedance regardless of decreased loading on said amplifier,
   said compensating means comprising means for providing A.C. negative feedback signals for stabilizing the gain of said amplifier,
   said A.C. negative feedback signal extending from the collector of said second transistor to the emitter of said first transistor,
   means for providing a D.C. negative feedback signal for stabilizing said biasing potentials, and
   means for providing an A.C. positive feedback signal for controlling the output impedance of said amplifier,
   said A.C. positive feedback signal extending from said one side of said output transformer to the base of said first transistor.

2. The amplifier of claim 1 and carrier communication path means for transmitting signals over a long distance, means for connecting said communication path to apply said transmitted signals to the base of the said first transistor, means for connecting the collector of the second transistor to said communication path so that said transmitted signals normally flow in from said path through said amplifier means and out over said path, and means for regulating the signal strength level applied to said first transistor input as a function of the signal strength level of the output signal of said second transistor.

3. An amplifier having a plurality of cascaded stages of amplification comprising at least one electronic means in each of said stages for amplifying the signals transmitted through said amplifier,
   means for applying D.C. biasing potentials to said electronic means for establishing the operating points thereof,
   means for providing an A.C. negative feedback signal for stabilizing the gain of said amplifier,
   means for providing a D.C. negative feedback signal for stabilizing said biasing potentials,
   carrier communication path means for transmitting signals over a long distance,
   means for connecting said communication path to apply said transmitted signals to the input of a first of said stages of said amplifier,
   means for applying the output of a succeeding stage of said amplifier to said communication path so that said transmitted signals normally flow in from said path through said amplifier means and out over said path,
   means for regulating the signal strength level applied to said first stage input as a function of the signal strength level of the output signal of said succeeding stage,
   reference level means,
   means for comparing the output signal strength level with said reference level,
   means responsive to said comparing means detecting a predetermined signal strength difference for by-passing said carrier communication path around said amplifier means thereby violently varying the load at the output of said amplifier, and
   means for providing an A.C. positive feedback signal for controlling the output impedance of said amplifier.

4. The amplifier of claim 3 and means for transmitting a pilot signal over said communication path along with said transmitted signal, whereby said pilot and transmitted signals experience similar attenuating conditions, means associated with said amplifier for separating said pilot and transmitted signals, and said comparing means comprising means for comparing the voltage level of said pilot signal amplified by said amplifier with the voltage level of said reference.

5. The amplifier of claim 4 wherein the A.C. positive feedback is a function of the load current.

6. The amplifier of claim 5 wherein the negative feedback is a voltage generated across an impedance output transformer means serving said amplifier and means coupling said feedback impedance means in series with said transformer primary to connect said amplifier output currents in series with said impedance.

7. The amplifier of claim 6 wherein said impedance means is a resistor.

8. The amplifier of claim 6 wherein said impedance means is an inductor in series with a resistor.

9. The amplifier of claim 6 and means including an L pad for coupling said A.C. feedback voltage to the input of a first of said plurality of stages and means for adjusting said L pad component values to increase the excitation to the first stage as the load increases.

10. The amplifier of claim 9 wherein said plurality of stages includes only two stages and means for directly coupling said first and second stages.

References Cited

UNITED STATES PATENTS

| | | | |
|---|---|---|---|
| 2,886,659 | 5/1959 | Schroeder | 330—102 X |
| 3,328,716 | 6/1967 | Fish et al. | 330—145 X |
| 3,113,268 | 12/1963 | Horak | 330—151 X |
| 3,188,574 | 6/1965 | Parmer | 330—8 X |

FOREIGN PATENTS

| | | |
|---|---|---|
| 154,390 | 7/1951 | Australia. |
| 840,666 | 7/1960 | Great Britain. |
| 1,336,511 | 7/1963 | France. |

ROY LAKE, *Primary Examiner.*

J. B. MULLINS, *Assistant Examiner.*

U.S. Cl. X.R.

330—28, 26, 52, 100, 137, 151; 179—170.4, 170.8